(12) United States Patent
Kanaya

(10) Patent No.: US 6,706,600 B2
(45) Date of Patent: Mar. 16, 2004

(54) METHOD OF FABRICATING A SPLIT-GATE SEMICONDUCTOR DEVICE

(75) Inventor: Masayoshi Kanaya, Miyagi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 3 days.

(21) Appl. No.: 10/229,052

(22) Filed: Aug. 28, 2002

(65) Prior Publication Data

US 2003/0054611 A1 Mar. 20, 2003

(30) Foreign Application Priority Data

Sep. 19, 2001 (JP) ........................................ 2001-284680

(51) Int. Cl.[7] .......................................... H01L 21/8247
(52) U.S. Cl. ........................................ 438/266; 438/952
(58) Field of Search ................................ 438/257–267, 438/952

(56) References Cited

U.S. PATENT DOCUMENTS 5,298,446 A * 3/1994 Onishi et al. ............... 438/303
5,930,627 A * 7/1999 Zhou et al. .................. 438/257
6,022,776 A * 2/2000 Lien et al. ................... 438/253

OTHER PUBLICATIONS

Wolf et al., "Silicon Processing for the VLSI Era vol. 1: Process Technology", pp. 547–557, Lattice Press, 1986, pp. 547–557.*

* cited by examiner

*Primary Examiner*—Richard A. Booth
(74) *Attorney, Agent, or Firm*—Volentine Francos, PLLC

(57) ABSTRACT

A split-gate semiconductor device is fabricated by forming floating gates on the sidewalls of the control gates of transistors, then using a bottom anti-reflective coating as a mask while removing unnecessary floating gates, preferably by an isotropic dry etching process that removes floating-gate material from the sidewalls faster than it removes dielectric material from the upper parts of the control gates. Alternatively, control gate structures are formed, floating-gate material is deposited, removed, then deposited again to form floating gates on the sidewalls of the control gate structures, and the central parts of the control gate structures are etched to leave control gates with floating gates on one sidewall each.

15 Claims, 6 Drawing Sheets

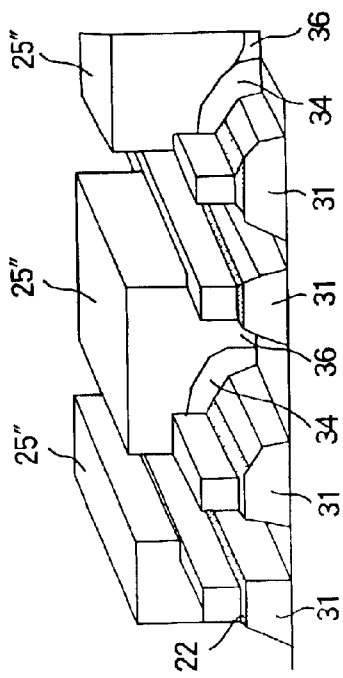
FIG.5A
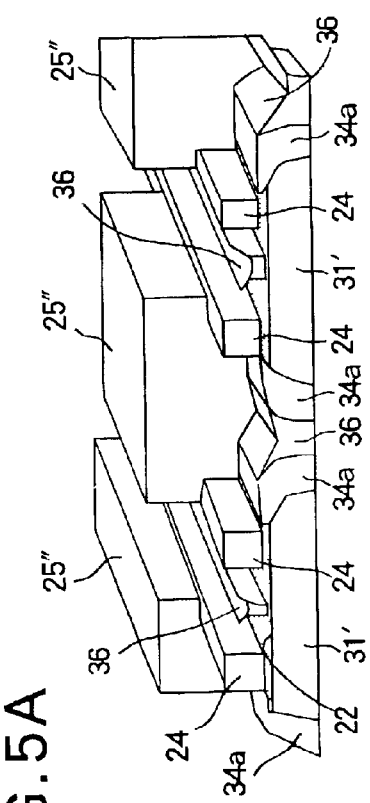
FIG.5B
FIG.5D
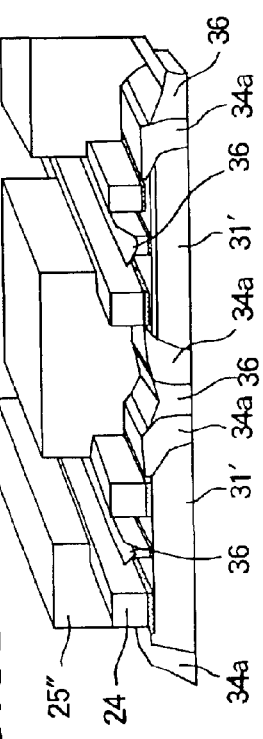
FIG.5C
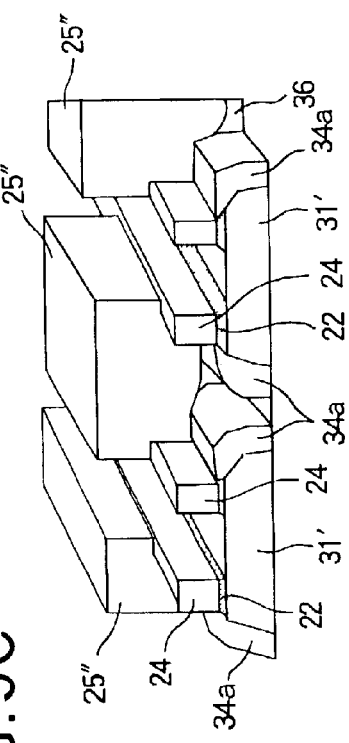
FIG.5E

METHOD OF FABRICATING A SPLIT-GATE SEMICONDUCTOR DEVICE

BACKGROUND OF THE INVENTION

1. Field of the Invention

The present invention relates to a method of fabricating a semiconductor device, more particularly to methods of forming and removing floating gates in the fabrication of a semiconductor device having transistors with a split-gate structure.

2. Description of the Related Art

The split-gate structure is used in, for example, low-voltage electrically erasable programmable read-only memory (EEPROM). As shown in FIG. 6, a memory cell in this type of semiconductor device 100 comprises a field-effect transistor having a floating gate 101 and control gate 102 disposed side by side above the channel between the source (SRC) and drain (DRN). In this example, the drain includes a heavily doped $N^+$-type region and a more lightly doped N-type region, and the floating gate 101 also extends over the lightly doped N-type region. As shown, the source and drain may be shared with adjacent memory cells. The control gates 102 are insulated by a dielectric layer 103.

In one known split-gate fabrication process, the control gates 102 are formed first, as shown in FIG. 7A, the upper surface of each control gate 102 being covered by the dielectric layer 103. Typically, the control gates 102 have a thickness of two hundred fifty to four hundred nanometers (250–400 nm), and the dielectric layer 103 has a thickness of one hundred to two hundred nanometers (100–200 nm). As shown in FIG. 7B, a thin oxide film 104 and a thin nitride film 105 are deposited; then an etching mask is formed and the nitride film 105 is partially removed by etching in preparation for ion implantation, which forms the $N^+$ source regions. Next, as shown in FIG. 7C, a layer of polycrystalline silicon 106 (generally referred to as polysilicon or simply 'poly') is deposited and etched down to the height of the control gates 102 and their overlying dielectric layer, leaving polysilicon floating gates disposed in the desired areas, on the sidewalls of the control gates 102.

Other fabrication steps, such as the drain formation steps, have been omitted from the above description for simplicity.

One problem with this fabrication process is that at the stage shown in FIG. 7C, polysilicon material is also left over the $N^+$ source regions. The polysilicon material may react with the underlying substrate material in a way that impairs the properties of the $N^+$ source regions. Furthermore, depending on the dimensions of the source regions, the polysilicon may fail to fill the slits between adjacent control gates, which is troublesome in subsequent fabrication steps.

Another problem is that if the polysilicon layer 106 is etched by a dry etching process using conventional etching techniques, exposed oxide material may be removed and the dielectric layer protecting the control gates 102 may be etched. This problem does not occur if a wet etching process is used, but wet etching cannot form the desired floating gate structure on the sidewalls of the control gates 102.

Yet another problem is that after the floating gates have been formed, some of them must be removed by further etching, to create transistors without floating gates. Such transistors are needed in peripheral circuits, for example. Once the floating gates have been implanted, however, they are not easily removed by either wet or dry etching without damage to other parts of the device or the creation of height irregularities.

SUMMARY OF THE INVENTION

An object of the present invention is accordingly to provide a fabrication process that can etch unwanted floating-gate material from a split-gate semiconductor device without damaging desired control-gate material.

Another object is to reduce the height differential between transistors that retain their floating gates and transistors from which the floating gates are removed.

Yet another object is to provide a fabrication process that can etch oxide films in control gate structures without etching field oxide material.

According to one aspect of the invention, a semiconductor device having a plurality of transistors, some of the transistors having split gates including respective control gates and floating gates, other transistors having only control gates, is fabricated by forming the control gates of the transistors, forming an oxide film and a nitride film covering the sidewalls of the control gates, forming floating gates on the covered sidewalls of the control gates, forming a bottom anti-reflective coating, and removing unwanted ones of the floating gates, using the bottom anti-reflective coating as a mask.

The control gates may include a dielectric layer such as a non-silicate glass layer or a nitride layer. The unwanted floating gates are preferably etched isotropically, using a gaseous mixture of carbon tetrafluoride, chlorine, and oxygen that etches the floating-gate material more rapidly than the dielectric material, so that the control gate material is protected by the dielectric layer during the etching process.

This process enables floating gates to be formed and removed without creating great differences in height between transistors with floating gates and transistors without floating gates. Floating gates may be created simultaneously on both the source and drain sides of the control gates.

According to another aspect of the invention, a split-gate semiconductor device is fabricated by forming a first oxide film on a substrate, forming a control gate layer on the first oxide film, forming a non-silicate glass layer on the control gate layer, forming a silicon nitride layer on the non-silicate glass layer, and selectively etching these layers by dry etching to form control gate structures. Each control gate structure includes a control gate part, a non-silicate glass part, and two silicon nitride parts. The upper surfaces and sidewalls of the control gate structures and the spaces between them are covered with a second oxide film and a silicon nitride film. A first polysilicon film is formed and etched to leave polysilicon covering the sidewalls of the control gate structures. P-type and N-type regions are formed in the substrate, the remaining part of the first polysilicon film is removed by wet etching, and the second oxide film and silicon nitride film are removed from the spaces between the control gate structures. A third oxide film is formed on the upper surfaces and sidewalls of the control gate structures and the spaces between them, and a second polysilicon film is formed on the third oxide film. The second polysilicon film is selectively removed by dry etching, leaving floating gates on the sidewalls of the control gate structures. The central parts of the control gate structures are then removed by etching, leaving control gates with floating gates formed on one sidewall.

This process enables floating gates of arbitrary size to be formed on the sidewalls of the control gates. When the central parts of the control gates are etched, a bottom anti-reflective coating can be used to protect the field oxide areas, enabling the conditions for etching the oxide film within the control gate structures to be controlled to achieve optimal etching of the control gate structures, without the unwanted removal of control gate material or field oxide material.

BRIEF DESCRIPTION OF THE DRAWINGS

In the attached drawings:

FIGS. 5A, 5B, 5C, 5D, and 5E illustrate steps in a fabrication process according to a fifth embodiment of the invention;

DETAILED DESCRIPTION OF THE INVENTION

Figure 1A:
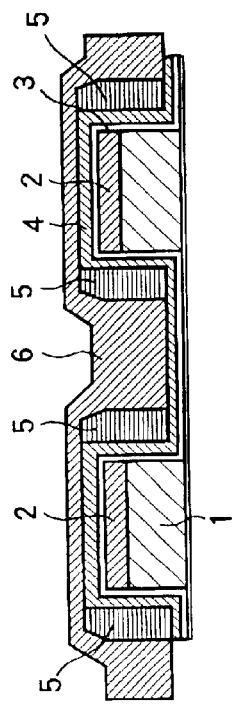
FIGS. 1A, 1B, 1C, 1D, 1E, 1F, and 1G illustrate steps in a fabrication process according to a first embodiment of the invention.

Embodiments of the invention will now be described with reference to the attached drawings, in which like elements are indicated by like reference characters. The embodiments show steps in the fabrication of a device such as an EEPROM. The device includes a plurality of split-gate transistors having both control gates and floating gates, and a plurality of transistors having only control gates.

The first embodiment of the invention is a process that forms split-gate transistors with floating gates disposed on both sidewalls of the control gate.

Figure 1B:
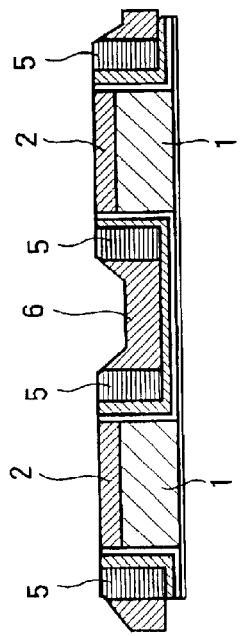

Referring to FIG. 1A, the first embodiment begins with the deposition of a layer of doped monocrystalline silicon or polysilicon as a control gate layer 1', the deposition of a dielectric layer such as a non-silicate glass (NSG) layer 2 with a thickness of one hundred to two hundred nanometers (100–200 nm) on the control gate layer 1', and the patterning of the NSG layer 2. Dry etching of the control gate layer 1' then forms control gates 1 as shown in FIG. 1B. As can be seen in FIG. 1B, the control gate layer 1' is deposited on a semiconductor substrate on which a thin oxide layer (the gate oxide) has already been formed. After the patterning of the control gates 1, a P-type impurity is implanted into the substrate to form P$^-$ regions in the source and drain areas between the control gates.

Figure 1C:
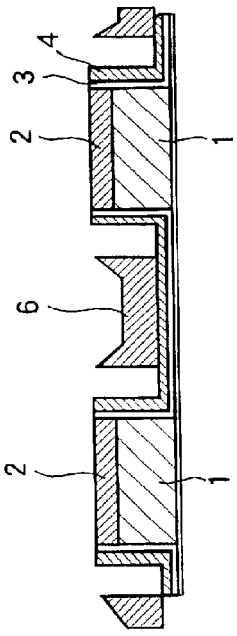
Figure 1D:
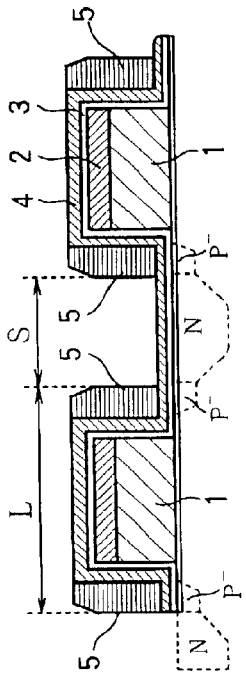

Next, as shown in FIG. 1C, a thermal oxide film 3 such a silicon dioxide ($SiO_2$) film is grown to a thickness of ten to twenty nanometers (10–20 nm), covering the upper surfaces and sidewalls of the control gates 1 and the spaces between them. A nitride film 4 such as a silicon nitride (SiN) film, likewise 10–20 nm thick, is then formed, covering the oxide film 3. After these thin films 3, 4 have been formed, polysilicon is deposited to a certain thickness and etched by dry etching to leave floating gates 5 with a thickness of one hundred eighty to two hundred nanometers (180–200 nm) on the sidewalls of the control gates 1, as shown in FIG. 1D.

Figure 6:
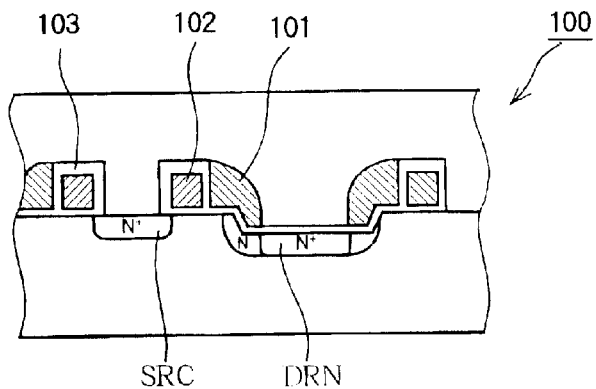
FIG. 6 is a sectional view of part of a split-gate semiconductor device.
Figure 7A:
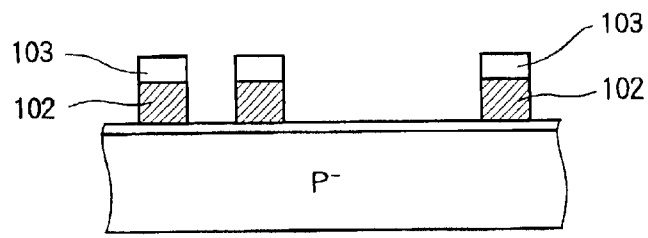
FIGS. 7A, 7B, and 7C illustrates steps in a conventional fabrication process for a split-gate semiconductor device.
Figure 7B:
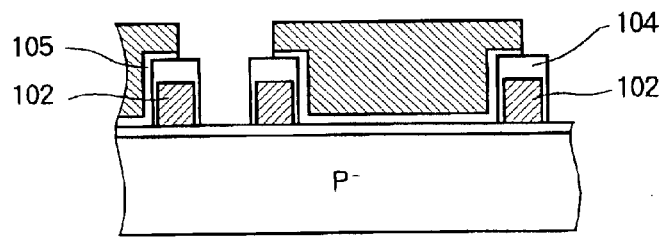
Figure 7C:
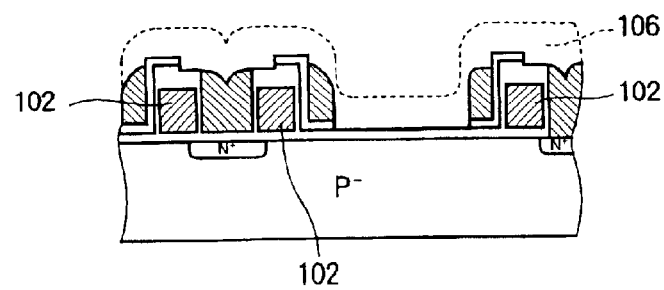

After the formation of the floating gates 5, an N-type impurity is implanted into the substrate to form the sources and drains of the transistors. The P$^-$-type regions that remain below the floating gates 5 are similar to the lightly doped drains (LDDs) shown in FIG. 6. For simplicity, these substrate regions are shown only in FIGS. 1B and 1D.

Figure 1E:
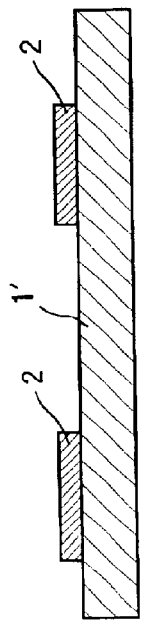

Preparatory to the removal of unwanted floating gates, the entire wafer surface is now coated with a bottom anti-reflective coating (BARC) 6 having a thickness of one hundred thirty to two hundred nanometers (130–200 nm), then with a photoresist layer (not shown). Photolithography is used to remove the photoresist from areas with unwanted floating gates, leaving the BARC film 6 exposed in these areas. FIG. 1E shows part of one such area after the photoresist has been removed.

Figure 1F:
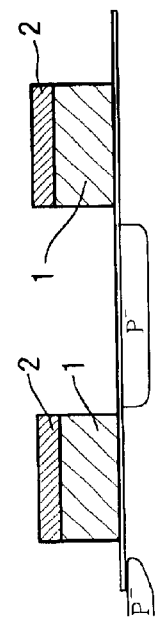
Figure 1G:
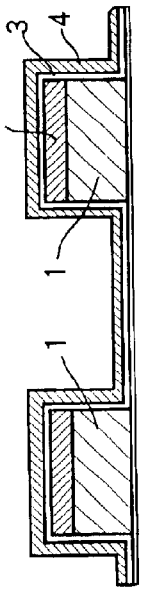

Referring to FIG. 1F, the BARC film 6, nitride film 4, and oxide film 3 are etched for about ten seconds (10 s) by carbon monoxide gas in an $SiO_2$ etcher. The etching gas is then switched to a mixture of carbon tetrafluoride, chlorine, and oxygen ($CF_4+Cl_2+O_2$) and isotropic dry etching is carried out under the conditions listed below. As shown in FIG. 1G, this etching process removes the unwanted floating gates 5 without etching the underlying nitride film 4 and oxide film 3.

The isotropic dry etching process is carried out for approximately forty seconds (40 s) with gas flows in the following ranges, given in cubic centimeters per minute (cc/min):

$CF_4$: 75 cc/min to 175 cc/min $Cl_2$: 0 cc/min to 80 cc/min $O_2$: 30 cc/min to 125 cc/min Under these conditions, the etching rate of the polysilicon constituting the floating gates 5 is more than twenty times as fast as the etching rate of the NSG film 2.

Although this etching process leaves the BARC film 6 present, as shown in FIG. 1G, the remaining BARC film 6 is removed together with the remaining photoresist (not shown) in a later step.

When the unwanted floating gates are removed, the oxide film 3 and nitride film 4 above the source and drain regions are not damaged because they are protected by the BARC film 6 and the photoresist. The dielectric NSG film 2 protecting the control gates 1 is etched only slightly by the dry etching process; the thickness of the NSG film 2 is reduced by less than 100 nm.

The BARC film 6 should be at least 130 nm thick because if it is less than 130 nm thick, coating irregularities in broad line (L) and space (S) areas (FIG. 1D), particularly in areas not covered by the control gates 1 and floating gates 5, may lead to exposure of the oxide film 3 below the nitride film 4 when the BARC film is etched.

The BARC film 6 should not be thicker than 200 nm because if it is thicker than 200 nm, then in areas where the line and space dimensions are narrow (for example, a quarter of a micrometer: L=0.25 μm and S=0.25 μm), a thick BARC layer will tend to form on the space areas. To remove enough of this thick BARC layer to expose the floating gates, it becomes necessary to extend the etching time so much that the oxide film below the BARC film may be exposed in areas with wide line and space dimensions.

If the oxide film 3 ($SiO_2$) is exposed when the BARC film 6 is etched, then when the unwanted floating gates 5 are etched, the exposed oxide film 3 will also be etched, leading to a leaky device. A BARC thickness of 130–200 nm avoids this problem by striking a proper balance between the requirements of areas with wide and narrow line-space dimensions.

Next, a second embodiment will be described. The second embodiment is similar to the first embodiment, but the NSG film used as a dielectric layer in the first embodiment is replaced with a silicon nitride (SiN) layer, which responds differently to dry etching. The following description will be confined to a description of the dry etching step. Other aspects of the second embodiment are the same as in the first embodiment.

Figure 2A:
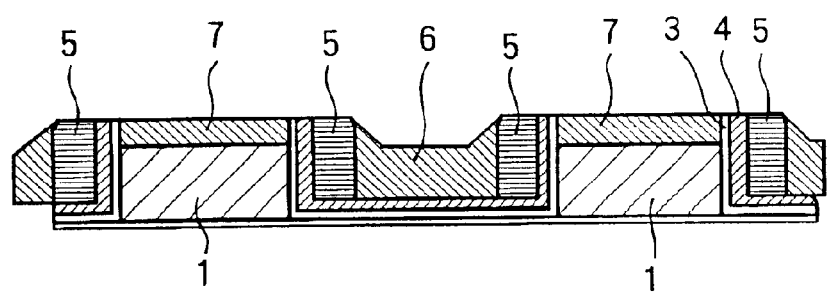
FIGS. 2A and 2B illustrate steps in a fabrication process according to a second embodiment of the invention.

FIG. 2A, which corresponds to FIG. 1F in the first embodiment, shows the state after the BARC film 6 has been etched to expose the floating gates 5 and the dielectric layer overlying the control gates 1. The dielectric layer is now an SiN film 7.

Figure 2B:
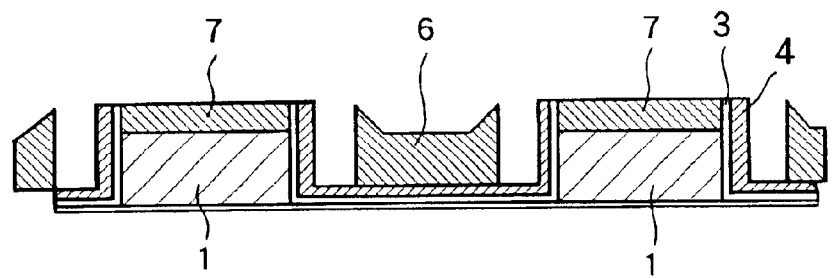

Isotropic dry etching is carried out using a mixture of carbon tetrafluoride, chlorine, and oxygen ($CF_4+Cl_2+O_2$) as an etching gas. As shown in FIG. 2B, this etching process removes the unwanted floating gates 5 without etching the underlying nitride film 4 and oxide film 3.

As in the first embodiment, the isotropic dry etching process is carried out for approximately forty seconds with gas flows in the following ranges:

$CF_4$: 75 cc/min to 175 cc/min
$Cl_2$: 0 cc/min to 80 cc/min
$O_2$: 30 cc/min to 125 cc/min Under these conditions, the etching rate of the polysilicon constituting the floating gates 5 is more than 1.5 times as fast as the etching rate of the SiN film 7. As the SiN film 7 is etched more slowly than the floating gates 5, the floating gates can be removed without etching the control gates 1.

If the dielectric SiN film 7 on the control gates 1 is not etched when the unwanted floating gates are removed, then in subsequent fabrication steps, there is less difference in height between cells in which the floating gates have been removed and cells in which the floating gates have not been removed. A resulting advantage is that contact holes can be etched with a more uniform aspect ratio, and contact faults due to contact holes with a high aspect ratio can be avoided.

Next, a third embodiment of the invention will be described. The third embodiment forms a floating gate on only one sidewall of each control gate, instead of on both sidewalls as in the preceding embodiments.

Figure 3A:
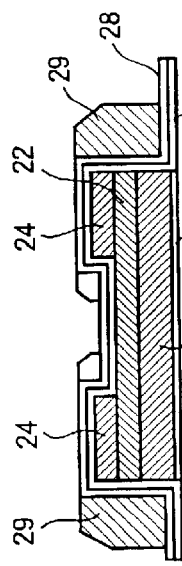
FIGS. 3A, 3B, 3C, 3D, 3E, 3F, 3G, 4A, 4B, and 4C illustrate steps in a fabrication process according to third and fourth embodiments of the invention.

Referring to FIG. 3A, a thin oxide film 23 such as a film of $SiO_2$ about 10 nm thick is formed on the surface of a wafer substrate (not visible), a polysilicon control gate layer 31' with a thickness of two hundred to four hundred nanometers (200–400 nm) is formed on the thin oxide film 23, and an NSG film 22 is grown to a thickness of approximately one hundred nanometers (100 nm) as a dielectric layer on the control gate layer 31'. A silicon nitride (SiN) film 24 approximately twenty nanometers (20 nm) thick is then deposited on the NSG film 22 by chemical vapor deposition (CVD), and the wafer is coated with a photoresist, which is patterned by photolithography to create a resist mask 25.

Figure 3B:
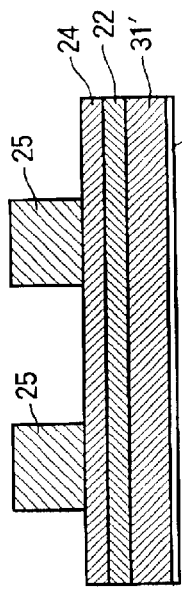
Figure 3C:
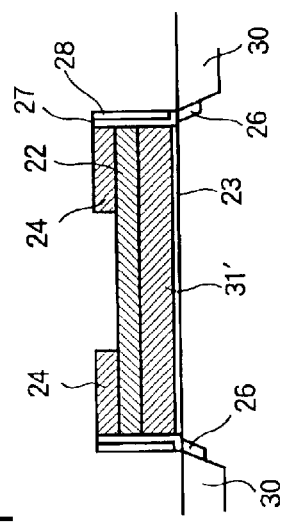

Referring to FIG. 3B, the SiN film 24 is etched to remove the portions not covered by the resist mask 25. The resist mask 25 is then removed and a new resist mask 25' is formed, covering what will become the drain regions of the device and the adjacent SiN areas. Dry etching is carried out as shown in FIG. 3C, etching those parts of the NSG film 22 and control gate layer 31' that are not protected by the SiN film 24 or resist mask 25', thereby exposing the original oxide film 23 in what will become the source regions of the device and leaving control gate structures between the source regions. Each control gate structure includes a control gate layer 31', an NSG film 22, and two parts of the nitride film 24, disposed at opposite sides of the control gate structure. P-type regions 26 are formed by ion implantation in the wafer substrate between the control gate structures.

Figure 3D:
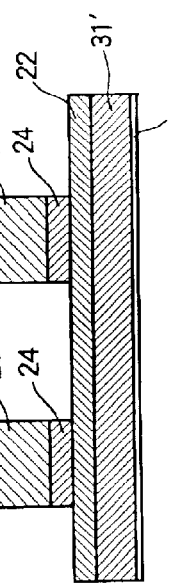
Figure 3E:
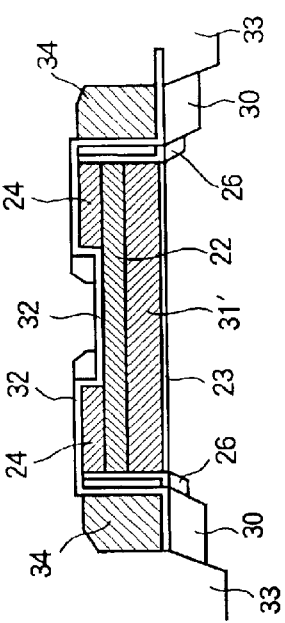
Figure 3F:
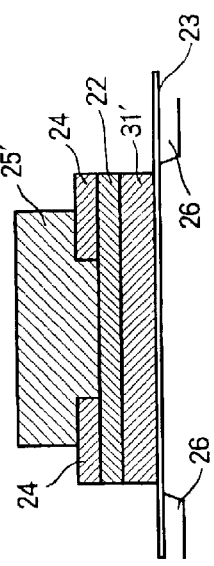

Referring to FIG. 3D, the entire wafer surface is covered with a new thin oxide ($SiO_2$) film 27, a nitride film 28 is formed on the oxide film 27, and a polysilicon film 29 approximately fifty nanometers (50 nm) thick is formed on the nitride film 28. The polysilicon film 29 is partly removed by dry etching as shown in FIG. 3E, exposing the nitride film 28 on the upper surfaces of the control gate structures, but leaving the sidewalls of the control gate structures covered by polysilicon. Further dry etching is performed to remove the nitride film 28 and oxide film 27 from the space between the control gate structures, and from other surfaces other than the sidewalls of the control gate structures and to remove the remaining polysilicon 29, as shown in FIG. 3F. Ion implantation is then carried out to form N-type regions 30 in the wafer substrate.

Figure 3G:
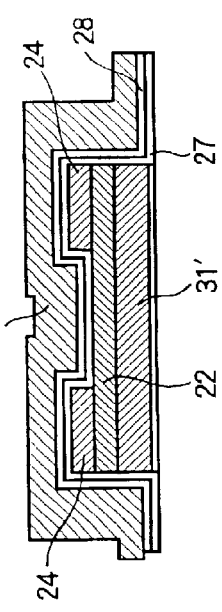

Referring to FIG. 3G, yet another thin oxide ($SiO_2$) film 32 is formed on the entire wafer surface, a new layer of polysilicon approximately one hundred nanometers (100 nm) thick is formed on this oxide film 32, and the new polysilicon layer is partially removed by dry etching to leave floating gates 34 on the sidewalls of the control gate structures. Ion implantation is performed to form $N^+$-type regions 33 in the substrate.

Figure 4A:
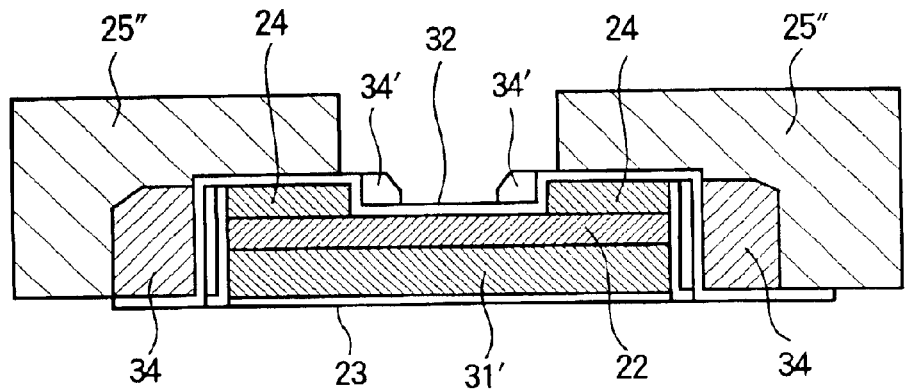
Figure 4B:
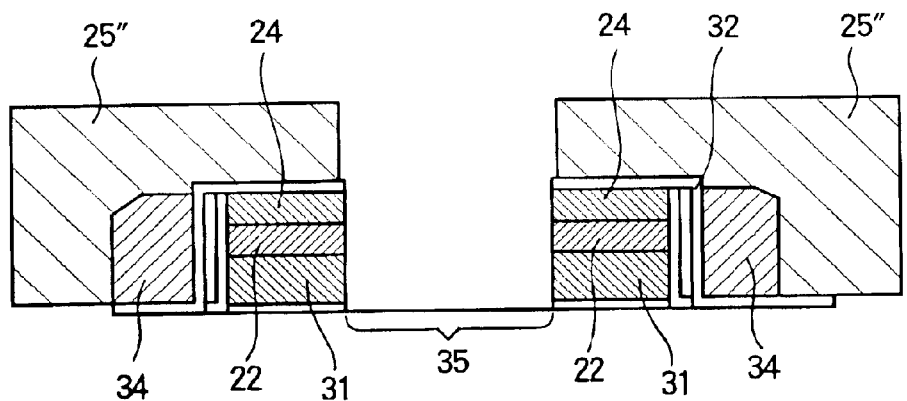
Figure 4C:
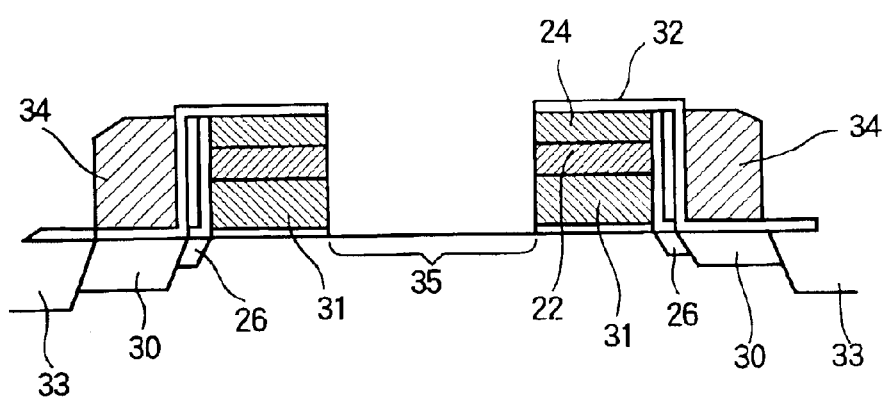

Referring to FIG. 4A, the wafer is coated with a photoresist, which is patterned by photolithography to create another resist mask 25" that exposes the central part of each control gate structure, including polysilicon regions 34' that were left when the floating gates 34 were formed. These remaining polysilicon regions 34', together with the thin oxide film 32, NSG film 22, and control gate layer 31' not protected by the resist mask 25" are removed by etching, as shown in FIG. 4B. The resist mask is then removed, leaving the structure shown in FIG. 4C, in which two control gates 31 adjoin a drain area 35, and floating gates 34 adjoin the control gates 31.

By etching the control gate structures to form the control gates after the floating gates have been formed, the third embodiment enables floating gates to be created on just one sidewall of each control gate without the need to remove floating gate material from the other sidewall.

The fourth embodiment, described next, is an elaboration of the third embodiment.

In the third embodiment, the polysilicon material from which the floating gates 34 are formed on the thin oxide film 32 is etched so as to align the height of the floating gates 34 with the upper surface of the SiN film 24 on the control gate layer 31', as shown in FIG. 3G.

In the fourth embodiment, after the resist mask 25" shown in FIG. 4A has been formed, a chlorine ($Cl_2$) etching process is carried out. This etching process attacks the exposed upper surfaces of the central part of the control gate structure, including both the thin oxide ($SiO_2$) film 32 and the unwanted polysilicon 34' disposed thereon, and is continued until the part of the thin oxide ($SiO_2$) film 32 not covered by the polysilicon 34' has been removed. Further etching is then performed for ten to twenty seconds, with an etching rate of about 200 nm/min, to remove the part of the thin oxide film 32 that was covered by the polysilicon 34'. Then, after the NSG film 22 has been etched, the central part of the control gate layer 31' is etched to form the control gates 31.

Floating gates 34 of an arbitrary size can be formed on one sidewall of the control gates 31 in this way. If the polysilicon height exceeds the height of the upper surface of the SiN film 24 on the control gate structure 31, the polysilicon must be etched to the desired height in relation to the control gates. Polysilicon must also be removed from areas in which floating gates are not needed. After the polysilicon has been etched down to the height of the floating gates, both polysilicon and SiO$_2$ are etched. This could lead to undesired etching of part of the control gate layer 31' that should become part of the control gates 31. The fourth embodiment avoids this undesirable etching of polysilicon in the control gates.

The method of forming the drain region in the third embodiment can be modified as explained below in the fifth embodiment.

FIG. 5A shows a perspective view of the wafer surface at a stage subsequent to FIG. 4A in the third embodiment. A bottom anti-reflective coating or BARC film 36, not shown in FIG. 4A, has been formed and etched to expose the tops of the polysilicon layers 34a on the sidewalls of the control gate structures. The BARC film 36 is left present in the spaces between these sidewall polysilicon layers 34a, and between the polysilicon 34' remaining within the control gate structures. The resist mask 25" has been formed, and patterned by photolithography, exposing the BARC film 36 and polysilicon 34' within the control gate structures. The polysilicon 34' and oxide 32 have been removed as described in the third or fourth embodiment, exposing the NSG film 22 that is not covered by the BARC film 36 or SiN film 24.

As shown in FIG. 5A, the resist mask 25" does not cover the BARC film 36 and polysilicon 34a disposed over field oxide regions (not visible) in the substrate. These field oxide regions are formed by local oxidation of silicon (LOCOS), a well-known process used for electrical isolation of mutually adjacent transistors.

Referring to FIG. 5B, the exposed NSG film 22 is etched. Next, the BARC film 36 and remaining NSG film 22 are etched in the central part of the control gate structures, as shown in FIG. 5C. This etching process also removes the BARC film 36 not protected by the resist mask 25" from the spaces between the control gate structures, fully exposing the polysilicon 34a that will not become floating gate material. Dry etching is then performed to remove the central part of the control gate layer 31' in each control gate structure and the unwanted polysilicon 34a, as shown in FIG. 5D. Finally, the resist mask 25" and the BARC film 36 beneath it are removed, leaving floating gates 34 formed on one sidewall of the control gate 31 of each transistor.

In the fifth embodiment, the BARC film 36 protects the field oxide regions, so that the SiO$_2$ film 32 within the control gate structures can be etched without etching the field oxides. The SiO$_2$ etching time can then be optimized to achieve the desired etching of openings in the central part of the control gate structures. The subsequent etching steps are also facilitated, due to the remaining polysilicon 34a.

The first and second embodiments, in which polysilicon floating gates were removed from peripheral transistors, can also be applied to the fabrication of devices with silicided or salicided gate structures.

The invention has been described in relation to polysilicon floating gates, but can also be applied to gate structures with oxide films.

Those skilled in the art will recognize that further variations are possible within the scope of the appended claims.

What is claimed is:

1. A method of fabricating a semiconductor device having a plurality of transistors, some of the transistors having split gates including respective control gates and floating gates, other ones of the transistors having control gates without floating gates, the method comprising:

forming the control gates of the transistors, the control gates having respective sidewalls;

forming an oxide film and a nitride film covering the sidewalls of the control gates and spaces therebetween;

forming floating gates on the covered sidewalls of the control gates;

forming a bottom anti-reflective coating so as to be disposed in the spaces between two opposing one of the control gates and to expose unwanted ones of the floating gates formed on the covered sidewalls of the control gates; and removing the unwanted ones of the floating gates, using the bottom anti-reflective coating as a mask.

2. The method of claim 1, wherein the bottom anti-reflective coating has a thickness of one hundred thirty nanometers to two hundred nanometers.

3. The method of claim 1, wherein said forming a bottom anti-reflective coating comprises:

etching the bottom anti-reflective coating to expose the unwanted ones of the floating gates formed on the covered sidewalls of the control gates; and wherein said removing the unwanted one of the floating gates comprises isotropically etching the unwanted ones of the floating gates, using a gaseous mixture of carbon tetrafluoride (CF$_4$), chlorine (Cl$_2$), and oxygen (O$_2$).

4. The method of claim 3, wherein the gaseous mixture has flow rates, measured in cubic centimeters per minute (cc/min) of:

CF$_4$, 75 cc/min to 175 cc/min;

Cl$_2$, 0 cc/min to 80 cc/min; and

O$_2$, 30 cc/min to 125 cc/min.

5. The method of claim 4, wherein the gaseous mixture is used for a time adequate to etch and remove the floating gates without removing the oxide film below the floating gates.

6. The method of claim 5, wherein said time is approximately forty seconds.

7. The method of claim 3, wherein the control gates are covered by a dielectric layer etched more slowly than the floating gates by the gaseous mixture.

8. The method of claim 7, wherein the dielectric layer comprises non-silicate glass (NSG).

9. The method of claim 8, wherein the floating gates are etched twenty times as fast as the dielectric layer.

10. The method of claim 7, wherein the dielectric layer comprises silicon nitride (SiN).

11. The method of claim 10, wherein the floating gates are etched 1.5 times as fast as the dielectric layer.

12. A method of fabricating a semiconductor device having transistors with split gates, comprising:

forming a first oxide film of silicon dioxide (SiO$_2$) on a substrate;

forming a control gate layer having a thickness of from two hundred nanometers to four hundred nanometers on the first oxide film;

forming a non-silicate glass (NSG) layer approximately one hundred nanometers thick on the control gate layer;

forming a silicon nitride (SiN) layer approximately twenty nanometers (20 nm) thick on the NSG layer;

selectively etching the SiN layer, using a resist mask;

selectively etching the NSG layer and the control gate layer by dry etching to form control gate structures with spaces therebetween, the control gate structures having upper surfaces and sidewalls, each control gate structure including a control gate part, an NSG part, and two SiN parts;

forming a second oxide film and an SiN film covering the upper surfaces and sidewalls of the control gate structures and the spaces therebetween;

forming a first polysilicon film, approximately fifty nanometers thick, covering the control gate structures and the spaces therebetween;

etching the first polysilicon film by dry etching to remove the first polysilicon film from the upper surfaces of the control gate structures, leaving the first polysilicon film covering the sidewalls of the control gate structures;

forming P-type and N-type regions in the substrate;

removing the first polysilicon film from the sidewalls of the control gate structures by wet etching;

removing the second oxide film and the SiN film from the spaces between the control gate structures;

forming a third oxide film covering the upper surfaces and sidewalls of the control gate structures and the spaces therebetween;

forming a second polysilicon film, approximately one hundred nanometers thick, on the third oxide film;

etching the second polysilicon film by dry etching to remove the second polysilicon film from the upper surfaces of the control gate structures and the spaces therebetween, leaving the second polysilicon film present on the sidewalls of the control gate structures, thereby forming floating gates on the sidewalls of the control gate structures; and selectively etching the control gate structures to remove central parts thereof, thereby forming control gates, each control gate having a floating gate on one sidewall.

13. The method of claim 12, wherein etching the second polysilicon film by dry etching leaves the second polysilicon film present on the sidewalls of the control gate structures to a height matching a height of a top surface of the SiN parts of the control gate structures.

14. The method of claim 12, wherein selectively etching the control gate structures to remove central parts thereof further comprises:

removing remaining parts of the second polysilicon film from said central parts by etching with chlorine gas ($Cl_2$);

etching the third oxide film to remove parts thereof that were not covered by said remaining parts of the second polysilicon film; and etching the third oxide film, to remove parts thereof that were covered by said remaining parts of the second polysilicon film, at a rate of approximately two hundred nanometers per minute (200 nm/min) for approximately ten to twenty seconds.

15. The method of claim 12, wherein selectively etching the control gate structures to remove central parts thereof further comprises:

depositing a bottom anti-reflective coating;

etching the bottom anti-reflective coating sufficiently to expose the second polysilicon film;

covering the bottom anti-reflective coating with a resist mask;

patterning the resist mask by photolithography, thereby selectively exposing the bottom anti-reflective coating;

removing the exposed bottom anti-reflective coating and the NSG layer; and removing the central part of the control gate layer in each control gate by dry etching.

* * * * *